United States Patent
Ito et al.

(10) Patent No.: US 7,184,351 B2
(45) Date of Patent: Feb. 27, 2007

(54) SEMICONDUCTOR MEMORY DEVICE

(75) Inventors: Yutaka Ito, Tokyo (JP); Takeshi Hashimoto, Tokyo (JP); Eiji Yamasaki, Tokyo (JP); Shigeo Takeuchi, Tokyo (JP); Masayuki Kaneda, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 61 days.

(21) Appl. No.: 11/154,625

(22) Filed: Jun. 17, 2005

(65) Prior Publication Data

US 2005/0286331 A1 Dec. 29, 2005

(30) Foreign Application Priority Data

Jun. 18, 2004 (JP) .............................. 2004-181735

(51) Int. Cl.
*G11C 7/00* (2006.01)
(52) U.S. Cl. ....................... 365/222; 365/227; 365/228
(58) Field of Classification Search ................ 365/222, 365/227, 228
See application file for complete search history.

(56) References Cited

U.S. PATENT DOCUMENTS

| | | | |
|---|---|---|---|
| 6,697,992 B2 | 2/2004 | Ito et al. | |
| 6,795,362 B2 | 9/2004 | Nakai et al. | |
| 6,965,537 B1* | 11/2005 | Klein et al. | 365/222 |
| 7,085,152 B2* | 8/2006 | Ellis et al. | 365/149 |

FOREIGN PATENT DOCUMENTS

| | | |
|---|---|---|
| JP | 2002-56671 A | 2/2002 |
| JP | 2003-68076 A | 3/2003 |

* cited by examiner

*Primary Examiner*—Anh Phung
*Assistant Examiner*—Pho M. Luu
(74) *Attorney, Agent, or Firm*—Sughrue Mion, PLLC

(57) ABSTRACT

A semiconductor memory device including an on-chip ECC circuit and having a data retention mode which includes, in the order of state transition, an encoding state EEST by an error correction circuit in which the error correction circuit carries out calculation of parity bits of data of the memory cells, a burst self-refresh state BSST in which the memory cells are self-refreshed in a burst with a period shorter than in ordinary self-refresh, a power-off state PFST in which an internal power supply circuit is partially turned off, a power-on state PNST in which the internal power supply circuit, partially turned off, is turned on, and a decoding state EDST by the error correction circuit in which the error correction circuit corrects errors of the memory cells. In case a command for exiting from the data retention mode in the encoding state, transition may be made to an idle state IST so that re-entry may be made from the decoding state EDST to the BSST.

10 Claims, 12 Drawing Sheets

SEMICONDUCTOR MEMORY DEVICE

FIELD OF THE INVENTION

This invention relates to a power controlling method for a semiconductor memory device having memory cells in need of refresh for data retention, and a semiconductor memory device employing the power controlling method.

BACKGROUND OF THE INVENTION

FIG. 11 is a diagram showing the configuration of a conventional semiconductor memory device including an ECC (error checking and correction) codec (coder/decoder circuit). FIG. 11 is based on FIG. 1 of Patent Publication 1 and forms the premises of the present invention, and hence is now described schematically.

Referring to FIG. 11, this semiconductor memory device is a clock synchronized type SDRAM (synchronous dynamic random access memory) including four memory cell arrays 11A to 11D in association with four memory banks. Each of the memory cell arrays 11A to 11D includes a matrix array of dynamic memory cells. The gate terminal of a memory cell transistor, not shown, is connected to a word line, not shown. One of the drain and the source of the memory cell transistor is connected to complementary bit lines, not shown, from row to row, and the other of the drain and the source of the memory cell transistor is connected to one end of a capacitor for data storage. A word driver, not shown, drives the selected word line, not shown, of the memory cell array to a boosted potential, in accordance with the decoded result of the row address by the row decoders 3A to 3D. The complementary bit lines, not shown, of the memory cell array, are connected to the I/O line by sense amplifiers 12A to 12D and column decoders 2A to 2D. The sense amplifier receives and amplifies the potential difference developed across the complementary bit lines by data read from the memory cell. The I/O bus (IO BUS) is commonly used by the respective memory banks and connected to an output terminal of an input circuit 4 and to an input terminal of an output circuit 5 via a multiplexer 6. A terminal DQ is a data input/output terminal.

An address signal, supplied from an address input terminal AD, is entered to and held by a row column address buffer 8. An X(row)-address is supplied to row address decoders 3A to 3D, while a Y(column)-address is supplied to column decoders 2A to 2D.

A refresh counter 9 generates a row address for self-refresh. During the self-refresh, the row address from the refresh counter 9 is selected in place of the external address AD and supplied to the row decoders 3A to 3D. The data of the memory cells, connected to a selected word line corresponding to the row address, are read on the respective bit lines and amplified by the sense amplifiers so as to be re-stored in the memory cells.

A self-refresh circuit 22 controls the operation and the period of self-refresh.

A command decoder 21 receives and decodes external and internal commands, depending on the operating mode. More specifically, the command decoder 21 is supplied with a clock signal CLK, a clock enable signal CKE, a chip enable signal /CE, a column address strobe signal /CAS, a row address strobe signal /RAS and a write enable signal /WE to generate internal timing signals for controlling the operating mode of the SDRAM and the operation of the respective circuit blocks, based on the signal level changes or timings. The chip enable signal /CE at its low level commands a start of a command input cycle. When the chip enable signal /CE is at a high level (or a chip non-selection state), other inputs are not significant. However, a memory bank selection state and an internal operation such as a burst operation are not influenced by a change to the chip non-selection state. Functions of the respective signals such as the /RAS, /CAS, and /WE are different from those of the corresponding signals in a ordinary DRAM, and these signals are made to be significant when a command cycle is defined.

The clock enable signal CKE is the signal to instruct effectiveness of the subsequent clock signal CLK. The clock enable signal CKE at a high level indicates that the rising edge of the subsequent clock signal CLK is effective. The clock enable signal CKE at a low level indicates that the rising edge of the subsequent clock signal CLK is ineffective.

In the configuration shown in FIG. 11, the command decoder 21 includes an ECC mode decoder 31 and a self mode decoder 32, in addition to the function of a command decoder for ordinary commands, such as bank-active, read/write or pre-charge. The command decoder 21 generates a row-address strobe signal φ RAS, based on a self-refresh signal φ SRF, supplied from the self-refresh circuit 22, to send the so generated signal to the row column address buffer 8.

When the clock enable signal CKE has changed from a high level to a low level, the ECC mode decoder 31 decodes the chip enable signal /CE, row address strobe signal /RAS, column address strobe signal /CAS and write enable signal /WE, all of which are supplied in synchronism with the clock signal CLK. When it is judged that the setting is that for a data retention operating mode, realizing super low power consumption, with the internal power supply circuit being partially turned off, the ECC mode decoder 31 generates a high-level encoding start signal ENST to send the so generated signal to an ECC controller 23, while setting a super low power flag SLPF (Super Low Power Flag), and an encoding flag, not shown, indicating that an ECC circuit (ECC codec) 24 is in the encoding state (in the state of generating the parity by the encoding circuit), to an activated state. On receipt from the ECC controller 23 of an encoding end signal ENED, indicating that the encoding in the ECC circuit 24 has come to a close, the ECC mode decoder 31 resets the encoding flag.

When a command for canceling the data retention mode has been supplied from outside, by the clock enable signal CKE changing from a high level to a low level, the ECC mode decoder 31 resets the super low power flag SLPF. At this time, the ECC mode decoder 31 judges, based on the set state or the reset state of the encoding flag, whether the state which has prevailed so far is such a state where, with the current mode being a data retention mode, the ECC circuit 24 has finished the encoding, or such a state where, with the current mode being a ordinary self-refresh mode, the ECC circuit 24 is not engaged in the encoding operation. If, as a result of the above judgement, the operating mode is the data retention mode, and the ECC circuit 24 has finished the encoding, the ECC mode decoder 31 generates a decoding start signal DEST of an activated state (high level) to send the so generated signal to the ECC controller 23, while setting a decode flag, not shown, indicating that the decoding by the ECC circuit 24 (the operation of correcting errors by the decoding circuit) is under way. When supplied from the ECC controller 23 with a decoding end signal DEED indicating that the decoding in the ECC circuit 24 has come to a close, the ECC mode decoder 31 resets the decode flag.

If, when the potential at a preset internal location, supplied from an internal power supply circuit 27 has reached a preset value, and the internal power supply ON signal GON, indicating that the internal power supply has been turned on, has been changed from an inactivated state (low level) to an activated state (high level), the super low power flag SLPF is set, the ECC mode decoder 31 sets a second self-refresh start signal SRT2 to an activated state (high level). If, when the internal power supply ON signal GON has been changed from the inactivated state (low level) to the activated state (high level), the super low power flag SLPF has been reset, the second self-refresh start signal SRT2 is set to an activated state (high level). The ECC mode decoder 31 generates a decode start signal DEST in the activated state (high level), and sends the so generated signal to the ECC controller 23, while setting the decode flag.

If, when the clock enable signal CKE has changed from a high level to a low level, the self mode decoder 32 decodes the chip enable signal /CE, row address strobe signal /RAS, column address strobe signal/CAS and the write enable signal /WE, supplied in synchronism with the clock signal CLK, and has verified that the current operating mode is not the data retention mode but is a ordinary self-refresh mode, the self mode decoder generates a first self-refresh start signal SRT1 in the activated state (high level) to send the so generated signal to the self-refresh circuit 22 and to an OR circuit 28.

If, when the clock enable signal CKE has been changed from a high level to a low level, the self mode decoder 32 decodes the chip enable signal /CE, row address strobe signal /RAS, column address strobe signal/CAS and the write enable signal /WE, supplied in synchronism with the clock signal CLK, and has judged that the current mode is the data retention mode, the self mode decoder sets the super low power flag as the internal state flag, not shown. Meanwhile, it is sufficient that the super low power flag for the ECC mode decoder 31 is set to the same value as that for the self mode decoder 32 and hence the super low power flag for the ECC mode decoder 31 or that for the self mode decoder 32 may be used as a value of the signal line SLPF of FIG. 11.

If, when the command for canceling the data retention mode is supplied from outside, by the clock enable signal CKE changing from a high level to a low level, the self mode decoder 32 resets the super low power flag, not shown, while also resetting the first self-refresh start signal SRT1 and the second self-refresh start signal SRT2, also termed 'burst refresh signals', to the non-activated state (low level).

When supplied from the ECC controller 23 with the encoding end signal ENED, the self mode decoder 32 generates the second self-refresh start signal SRT2 in the activated state, and sends the so generated signal to the self-refresh circuit 22, OR circuit 28 and to the ECC mode decoder 31, in case the super low power flag SLPF has been set. In a similar manner, if, when the internal power supply ON signal GON, supplied from the internal power supply circuit 27, is changed from the inactivated state (low level) to the activated state, the super low power flag is set, the self mode decoder 32 generates the second self-refresh start signal SRT2 in the activated state, and sends the so supplied signal to the self-refresh circuit 22, OR circuit 28 and to the ECC mode decoder 31.

When supplied with the decoding end signal DEED in the activated state (high level), the self mode decoder 32 generates the first self-refresh start signal SRT1 in the activated state (high level), and sends the so generated signal to the self-refresh circuit 22 and to the OR circuit 28.

The self-refresh circuit 22 changes the oscillation frequency of a clock signal, generated by an internally provided oscillator, not shown, based on the first self-refresh start signal SRT1 or the second self-refresh start signal SRT2, in the activated state (high level), supplied from the self mode decoder 32, to generate the self-refresh signal φ SRF, which is sent to the command decoder 21.

When supplied with the first self-refresh start signal SRT1 in the activated state (high level), the self-refresh circuit 22 sets the oscillation frequency of the clock signal, generated by an oscillator, not shown, so that the refresh period TR will be a preset period. When supplied with the second self-refresh start signal SRT2 in the activated state (high level), the self-refresh circuit 22 sets the oscillation frequency of the clock signal, generated by the oscillator, not shown, so that the refresh period TR will be shorter than the usual refresh period, for effecting burst self-refresh.

If, as a result of termination of the burst self-refresh for the entire word lines of the entire memory cell arrays 11A to 11D, the value of an internally provided counter has become equal to a preset value corresponding to the number of the word lines, the self-refresh circuit 22 generates a self-refresh end signal SRED in the activated state (high level), indicating the end of the burst self-refresh, and sends the so generated signal to the self mode decoder 32 and to the timer 26.

Based on the self-refresh end signal SRED, the self-refresh circuit 22 generates an internal power supply OFF signal GOFF in the activated state, commanding the OFF of the internal power supply circuit 27, and sends the resulting signal to the internal power supply circuit 27.

Based on an internal power supply OFF end signal PEND, supplied from the timer 26, and which is indicative of the lapse of the time for turning off the internal power supply circuit 27 (also termed herein the 'internal power supply OFF time'), the self-refresh circuit 22 changes the internal power supply OFF signal GOFF from the activated state (high level) to the non-activated state (low level) and sends the resulting signal to the internal power supply circuit 27.

Based on the encoding start signal ENST, in the activated state (high level), supplied from the ECC mode decoder 31, the ECC controller 23 generates an internal command, an address signal AD and an encoding flag ENC for controlling the read/write operation during encoding, in synchronism with the internal clock signal CLKIn supplied from an internal clock circuit 25, and sends the internal command and the address signal AD to the command decoder 21, while sending the encoding flag ENC to the ECC circuit 24.

The command decoder 21 captures the internal command by a rising edge of the internal clock signal CLKIn as the signal changes from low to high.

When the parity calculations and the operation of writing of the parity field into all memory cells making up the memory cell arrays 11A to 11D, in the ECC circuit 24, the ECC controller 23 sends the encoding end signal ENED to the ECC mode decoder 31.

Based on the decoding start signal DEST, in the activated state (high level), supplied from the ECC mode decoder 31, the ECC controller 23 generates an internal command, an address signal AD and a decode flag DEC for controlling the readout/write during decoding, in synchronism with the internal clock signal CLKIn, and sends the internal command and the address signal AD to the command decoder 21, while sending the encoding flag ENC to the ECC circuit 24.

When the decoding as commanded has been finished in the ECC circuit 24, the ECC controller 23 sends the decoding end signal DEED to the ECC mode decoder 31 and to the self mode decoder 32.

Based on the encoding flag ENC, supplied from the ECC controller 23, the ECC circuit 24 accesses the memory cell arrays 11A to 11D, via multiplexer (MUX) 6, in synchronism with the internal clock signal CLKIn, supplied from the internal clock circuit 25, to perform parity calculations for correcting the errors of refresh failure bits and writing in the parity field in the memory cells.

In addition, based on the decode flag DEC, supplied from the ECC controller 23, the ECC circuit 24 accesses the memory cell arrays 11A to 11D, via multiplexer (MUX) 6, in synchronism with the internal clock signal CLKIn, to perform parity bit calculations and error correction of refresh failure bits.

The internal clock circuit 25 generates the internal clock signal CLKIn, employed by the ECC controller 23 and the ECC circuit 24.

Based on the self-refresh end signal SRED of a high level, supplied from the self-refresh circuit 22, the timer 26 commences the time count of the preset internal power supply OFF time, programmed using e.g. fuses. After lapse of the internal power supply OFF time, the timer 26 sends an internal power supply OFF end signal PEND to the self-refresh circuit 22.

If the super low power flag SLPF is reset during time count of the internal power supply OFF time, by the clock enable signal CKE going high from low, the timer 26 discontinues the time count of the internal power supply OFF time, and sends the internal power supply OFF end signal PEND of the high-level to the self-refresh circuit 22.

The internal power supply circuit 27 sends, to various parts of the semiconductor memory device, a variety of internal voltages, such as word line boost voltage (VPP), bit line potential, one-half of the bit line potential, plate voltage (VPLT), potential of the peripheral or the memory cell part substrate potential (VBB), while sending a high level activation signal ACT for supplying the above internal voltage or the external voltage to column decoders making up a set of column decoders 2A to 2D, row decoders making up a set of row decoders 3A to 3D, or to peripherals, such as a random logic.

Based on the internal power supply OFF signal GOFF of a high level, in the activated state, supplied from the self-refresh circuit 22, the internal power supply circuit 27 also halts the supply of the internal voltage to various parts of the semiconductor memory device, while causing the activation signal ACT to be changed from the activated (high level) state to the inactivated (low level) state to send the resulting signal to the peripheral circuitry. Moreover, when the internal power supply OFF signal GOFF, supplied from the self-refresh circuit 22, is changed from the activated state (high level) to the inactivated state (low level), the internal power supply circuit 27 commences to supply the internal voltage to various parts of the semiconductor memory device and causes the activation signal ACT to be changed from the inactivated (low level) state to the activated (high level) state to send the resulting signal to the peripheral circuitry. The internal power supply circuit 27 also monitors one of the potentials applied to various parts that takes the longest time until reaching a preset potential value, such as VPP or VBB, and detects that the potential in question has reached the preset potential value to send the internal power supply ON signal GON in the activated (high level) state to the ECC mode decoder 31 and to the self mode decoder 32.

The OR circuit 28 takes the logical sum of the first and second self-refresh start signals SRT1 and SRT2 to send the result to the row column address buffer 8.

FIG. 12 is a diagram showing an example of status transition of the semiconductor memory device shown in FIG. 11 hereof (see also FIG. 4 of Patent Publication 1).

When a command for entry to the data retention mode (SPC) is entered, a DRAM device, which has an ECC circuit on-chip and which performs power control during standby time to realize the data retention mode of low power consumption, enters from the normal operating mode (idle state IST) into the data retention mode. In the idle state (IST), the DRAM device waits for an access request (command) from a DRAM controller, not shown, and executes the access request when the access request is actually issued.

The ECC circuit 24 encodes the entire bits of the memory cell array to cause check bits (parity) to be stored in a check bit area in the memory cell array, that is, the ECC is in an encoding state (EEST). With the ECC encoding state (EEST), calculation of parity bits and writing the parity bits into the parity area of the memory cell array for correcting error of refresh failure bit are carried out by the ECC circuit 24 formed in the semiconductor chip.

When the encoding by the ECC circuit 24 is finished, and the encoding end signal ENED is received from the ECC controller 23, the self mode decoder 32 generates the second self-refresh start signal SRT2 to change from the ECC encoding state to the burst self-refresh state BSST. In contradistinction from the ordinary self-refresh, in which the refresh is carried out in a distributed fashion with the refresh period TR as set in dependence upon the refresh tolerance tREF, the refresh in the burst self-refresh state BSST is carried out in a burst with a shorter refresh period TR.

When the burst self-refresh for the entire word lines of the memory cell arrays 11A to 11D is finished, the self-refresh circuit 22 outputs a self-refresh end signal SRED to the self mode decoder 32 and to the timer 26. The self-refresh circuit 22 also generates the internal power supply OFF signal GOFF to send the so generated signal to the internal power supply circuit 27. The state then is changed from the self-refresh state to a power-off state PFST. In this power-off state PFST, part of the internal power supply voltage ceases to be supplied to the inside of the semiconductor memory device.

When the internal power supply OFF time has elapsed, the timer 26 outputs an internal power supply OFF end signal PEND to the self-refresh circuit 22. Based on the internal power supply OFF end signal PEND, the self-refresh circuit 22 inactivates the internal power supply OFF signal GOFF, used for activating the internal power supply circuit 27. The transition is made from the power-off state PFST to a power On state PNST.

When it is detected that the power supply potential, monitored by the internal power supply circuit 27, has reached a preset potential, the high-level internal power supply OFF signal GOFF is supplied to the ECC mode decoder 31 and to the self mode decoder 32. Since the internal power supply OFF signal GOFF is at a high level, with the operating mode being the data retention mode, the ECC mode decoder 31 generates the second self-refresh start signal SRT2 to move from the power On state PNST to the burst self-refresh state BSST.

If, with the burst self-refresh state BSST, the clock enable signal CKE is changed from a low level to a high level to render the rise of the clock signal CLK valid, and a preset exit command is entered, in order to cancel the super low power consumption mode (data retention mode), the ECC mode decoder 31 resets the super low power flag SLPF. The self mode decoder 32 also resets the super low power flag (internal), as the internal state flag, to cause the second self-refresh start signal SRT2 to change from high to low. The ECC mode decoder 31 generates a high-level decoding start signal DEST to send the signal to the ECC controller 23. This causes transition from the burst self-refresh state to the ECC decoding state EDST.

When the decoding in the ECC circuit 24 has been finished and the high-level decoding end signal DEED is received from the ECC mode decoder 31, the self mode decoder 32 generates the first self-refresh start signal SRT1 to make transition from the ECC decoding state EDST to the self-refresh state SRST.

For canceling the self-refresh state SRST, the clock enable signal CKE is caused to go from low to high. The self mode decoder 32 causes the first self-refresh start signal SRT1 to go from high to low. The self-refresh circuit 22 discontinues to generate the self-refresh signal φ REF, based on the low-level first self-refresh start signal SRT1. The command decoder 21 discontinues to generate the row-address strobe signal φ RAS because it is not supplied with the self-refresh signal φ REF from the self-refresh circuit 22, and transition is made from the self-refresh state SRST to the idle state IST.

In the ECC encoding state and in the ECC decoding state, there are occasions where the refresh operations are inserted from time to time in view of much time taken depending on the volume of the error detection/correction operations.

In this manner, the on-chip ECC circuit is provided to exercise power control, the refresh period is extended and refresh fail cells are restored by error correction by the ECC circuit, thereby enabling the long-term refresh with a refresh period equal to or longer than 1 sec, as well as reduction of the data retention current (reduction of the power supply current) (see Patent Publication 2). The super low power consumption data retention operation mode, realizing the long-term refresh with the refresh period exceeding the device tolerance (real power of the data retention characteristics) by the error correction with the ECC circuit, is herein termed the super self refresh mode (SSR mode).

[Patent Publication 1]
JP Patent Kokai Publication JP-P2003-68076A
[Patent Publication 2]
JP Patent Kokai Publication JP-P2002-56671A

SUMMARY OF THE DISCLOSURE

If, in a conventional semiconductor memory device, equipped with an on-chip ECC circuit and a data retention mode of super low power consumption, entry into the data retention mode with super low power consumption is once made and entry is subsequently made into the operation of exiting from the data retention mode with super low power consumption, re-entry into the data retention mode may not be made until after the completion of the operation of exiting from the data retention mode with super low power consumption, including prolonged decoding processing, and substantially returning to the idle state IST.

Thus, the system (including e.g. the CPU and the DRAM controller) is in a standby state until such time the semiconductor memory device executes the processing for exiting from the data retention mode with super low power consumption to return to the idle state IST. That is, in case the semiconductor memory device has commenced the operation of exiting from the data retention mode of super low power consumption, as a result of issuing the command for entry into the data retention mode of super low power consumption, it is not possible for the system to make re-entry immediately into the data retention mode of super low power consumption to proceed to the next processing. In order to make re-entry to the data retention mode, the system has to wait until such time the semiconductor memory device completes the processing of exiting from the data retention mode of super low power consumption to revert to the idle state. This stand-by time is elongated, depending on the volume of processing, such as decoding, in keeping with the tendency towards the increasing memory cell capacity.

Moreover, in exiting during encoding at the time of entry to the data retention mode of super low power consumption, return is made to the idle state IST through the burst self-refresh state BSST, ECC decoding state EDST and the self refresh state SRST. That is, re-entry to the data retention mode of the super low power consumption is not possible until after the end of the sequence of the above operations.

The same may be applied to the exiting processing in the power-off and in the power-on state. That is, re-entry is not possible until return is made to the idle state IST through the power-off state, power-on state, burst self-refresh state BSST, ECC decoding state EDST, and the self-refresh state SRST, in this order.

That is, the present inventors have become aware of the fact that, when making re-entry to the data retention mode of the super low power consumption, after once canceling the data retention mode of the super low power consumption, in the semiconductor memory device, the system side (CPU and the DRAM controller) has to be in a stand-by state until the exiting processing in the semiconductor memory device is finished and the idle state is again established, meaning that improvement is required from the perspective of system performance.

Accordingly it is an object of the present invention to provide a semiconductor memory device in which the system may re-enter into the data retention mode of super low power consumption without standby to enable other operations, and a controlling method therefor.

Another object of the present invention is to provide a semiconductor memory device in which reversion may be made quickly to the idle state at the time of exiting from the data retention mode of the super low power consumption, and a controlling method therefor.

The above and other objects are attained by the present invention that may be summarized as follows.

A method in accordance with one aspect of the present invention, is a method for controlling a semiconductor memory device comprising a plurality of memory cells in need of refresh for retention of data, and having retention mode with attendant power control, said data retention mode including a burst self-refresh state in which said memory cells are self-refreshed in a burst with a period shorter than in ordinary self-refresh;

a power-off state in which an internal power supply circuit is partially turned off; and a power-on state in which said internal power supply circuit, partially turned off, is turned on; said method comprising the steps of making an entry from an idle state into said data retention mode; and making a re-entry from a preset one of said states of said data retention mode to said data retention mode, without making return to said idle state by completing an exit process from said data retention mode, when a command for exiting from said data retention mode is received during said data retention mode.

According to the present invention, when a command for re-entry to the data retention mode is received in the decoding state by the error correction circuit, control is managed to cause transition from the decoding state by the error correction circuit to the burst self-refresh state.

According to the present invention, when a command from exiting the data retention mode is received in the power-off state or the power-on state, control is managed to cause transition from the power-off state or the power-on state to the decoding state by the error correction circuit, without transition from the power-off state or the power-on state to the burst self-refresh state.

According to the present invention, there may be provided such a step performing control to cause transition from the decoding state by the error correction circuit to the idle state without transition from the decoding state by the error correction circuit to the ordinary self-refresh state.

A semiconductor memory device in accordance with another aspect of the present invention comprises a plurality of memory cells in need of refresh for retention of data, and an error correction circuit including an encoding circuit for appending the parity information to data of memory cells and a decoding circuit for checking the memory cell data for errors and for correcting the errors if there are any. The semiconductor memory is equipped with has a data retention mode with attendant power control. The data retention mode includes an encoding state by the error correction circuit in which the error correction circuit carries out calculation of parity bits of data of the memory cells, a burst self-refresh state in which the memory cells are self-refreshed in a burst with a period shorter than in ordinary self-refresh, a power-off state in which an internal power supply circuit is partially turned off, a power-on state in which the internal power supply circuit, partially turned off, is turned on, and a decoding state by the error correction circuit in which the error correction circuit corrects errors of the memory cells. The semiconductor memory device comprises a circuit for performing control for transferring to the encoding state by the error correction circuit on making entry from the idle state to the data retention mode, transferring to the burst self-refresh state on termination of the encoding state by the error correction circuit, repeating the burst self-refresh state, the power-off state and the power-on state in this order until receipt of a command for exiting from the data retention mode, transferring from the burst self-refresh state to the decoding state by the error correction circuit, on receipt of the command for exiting from the data retention mode, and transferring to the idle state on receipt in the encoding state by the error correction circuit of the command for exiting from the data retention mode.

According to the present invention, there may be provided a circuit for performing control to cause transition from the decoding state by the error correction circuit to the burst self-refresh state when a command for re-entry to the data retention mode is received in the decoding state by the error correction circuit.

According to the present invention, there may be provided a circuit for performing control to cause transition from the power-off state or the power-on state to the decoding state by the error correction circuit, without transition from the power-off state or the power-on state to the burst self-refresh state, when a command from exiting the data retention mode is received in the power-off state or the power-on state.

According to the present invention, there may be provided a circuit for performing control to cause transition from the decoding state by the error correction circuit to the idle state without transition from the decoding state by the error correction circuit to the ordinary self-refresh state.

The meritorious effects of the present invention are summarized as follows.

According to the present invention, when the system exists from the data retention mode with low power consumption to make re-entry to the data retention mode, re-entry may be made directly immediately.

Moreover, according to the present invention, return to the idle state may be made promptly, when exiting from the data retention mode with low power consumption, thus contributing to improvement in the system performance. In addition, according to the present invention, re-entry may be made during the operation of exiting from the data retention operating mode with low power consumption, thus further contributing to improvement of system performance.

Still other objects and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED EMBODIMENTS OF THE INVENTION

Figure 11:
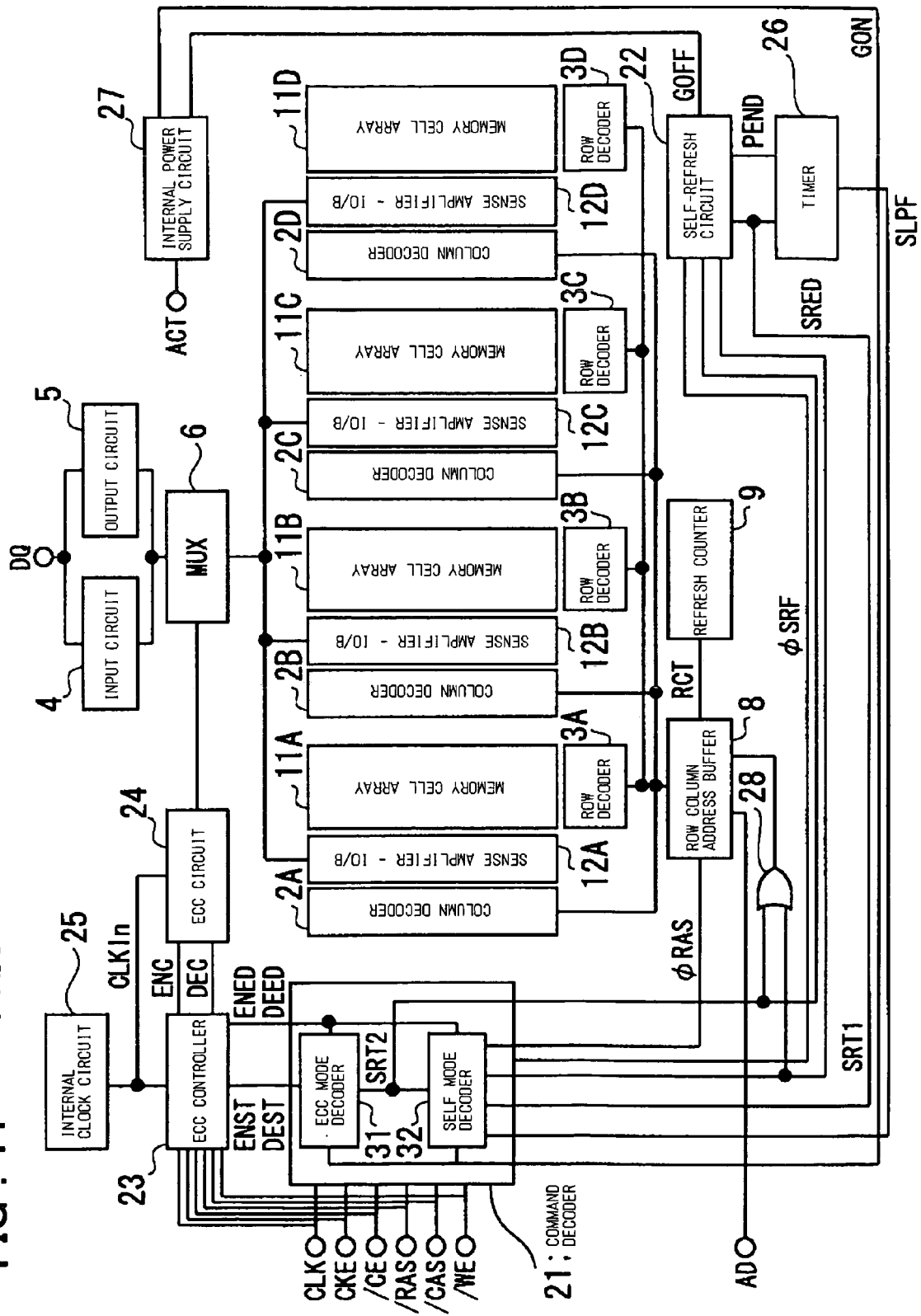
FIG. 11 is a diagram showing the overall structure of a conventional semiconductor memory device.
Figure 12:
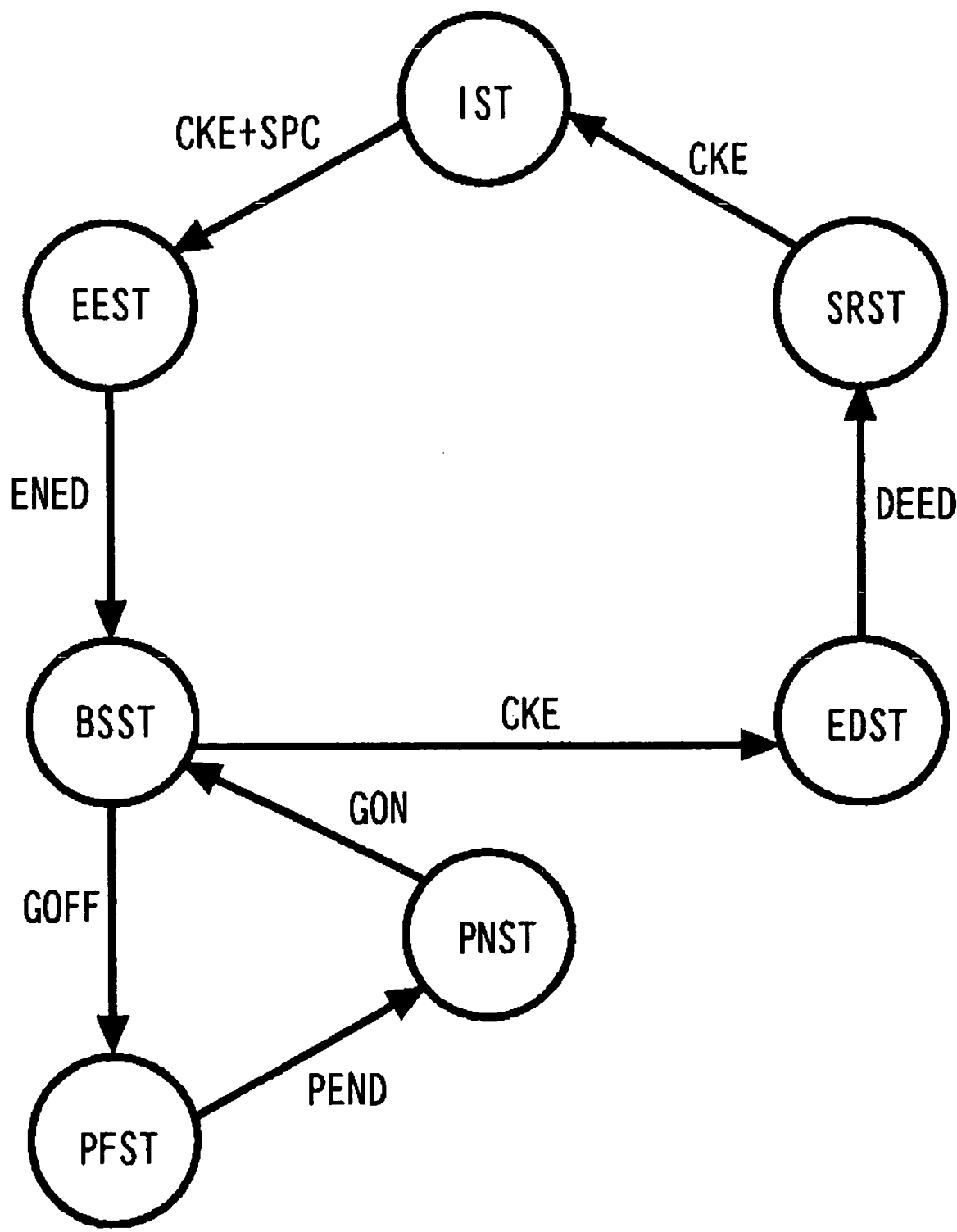
FIG. 12 is a status transition diagram showing the internal operations of a conventional semiconductor memory device.

The preferred embodiments of the present invention will now be described. With a semiconductor memory device according to the present invention, the status transition, shown in FIG. 12, has been improved, and the use of a DRAM device which includes an on-chip ECC circuit and has the function of the data retention mode of the super low power consumption, as described in connection with FIGS. 11 and 12, is presupposed. That is, the present invention is premised on the use of a DRAM device including an on-chip ECC (error correction circuit) and having, as the data retention mode (standby state), such a mode in which the parity information is generated by the ECC circuit and written in a check bit area of the memory cell array, cell refresh is carried out in a burst, at least part of the internal power supply circuit is turned off by way of power control, and in which the refresh failure cells are corrected for errors in the ECC circuit to elongate the refresh period to reduce the data retention current. This mode is referred to below as the 'super self refresh mode, abbreviated to the 'SSR mode'.

If, by the command SPC for the low power consumption mode and by the setting of the clock enable signal CKE to a low level, entry is made to the data retention mode of the super low power consumption, referred to below as the 'SSR mode', the encoding circuit of the ECC circuit appends the parity information to memory cell data to store the resulting data by way of encoding. The encoding circuit of the ECC circuit is driven by the internal clock signal at this time. That is, transition is made from the idle state (IST) to the ECC encoding state (EDST). After the end of the encoding, transition is made to burst cell refresh (BSST) of the memory cells of the memory cell array.

After the end of the burst cell refresh (BSST), the internal power supply OFF signal GOFF is supplied to the internal power supply circuit of the semiconductor memory device to set up a power-off state (PFST).

By the signal PEND, indicating that the internal power supply OFF time has lapsed, the power recovery state is set (PNST). By activation of the signal GON, the burst cell refresh state (BSST) is set.

If, at the time of burst refresh, the clock enable signals changes from low to high, transition is made to ECC decoding state in which error correction is carried out by the decoding circuit of the ECC circuit.

After the end of the decoding, transition is made to the self-refresh state (SRST) to revert to the idle state IST.

The burst cell refresh (BSST), power off (PFST) and the power on (PNST) are repeated until a cancel command is entered.

In the present embodiment, a command for canceling the SSR mode may be accepted during encoding by the ECC circuit (encoding circuit) (EEST state). If the command for canceling the SSR mode is issued during the encoding, transition is immediately made to the idle state (that is, transition to the encoding state EEST, burst self refresh state BSST, ECC decoding state EDST or to the self-refresh state SRST is not made). Thus, the system (inclusive of the CPU and the DRAM controller, not shown) may return to the idle state to carry out other processing operations. In addition, the system may immediately carry out re-entry to the SSR mode.

In addition, a command for canceling the SSR mode may be accepted during ECC decoding by the ECC circuit (decoding circuit) (EDST state). If a command for canceling the SSR mode is issued during decoding, transition is made to the burst self-refresh state BSST.

Moreover, in the present embodiment, in case the command for canceling the SSR mode is received during the power-off state (PFST), transition may be made to the ECC decoding state EDST such as to skip the burst self-refresh state BSST.

It is noted that transition may be made to the idle state such as to skip the self-refresh state SRST. Embodiments will be described more in detail with reference to drawings.

Figure 1:
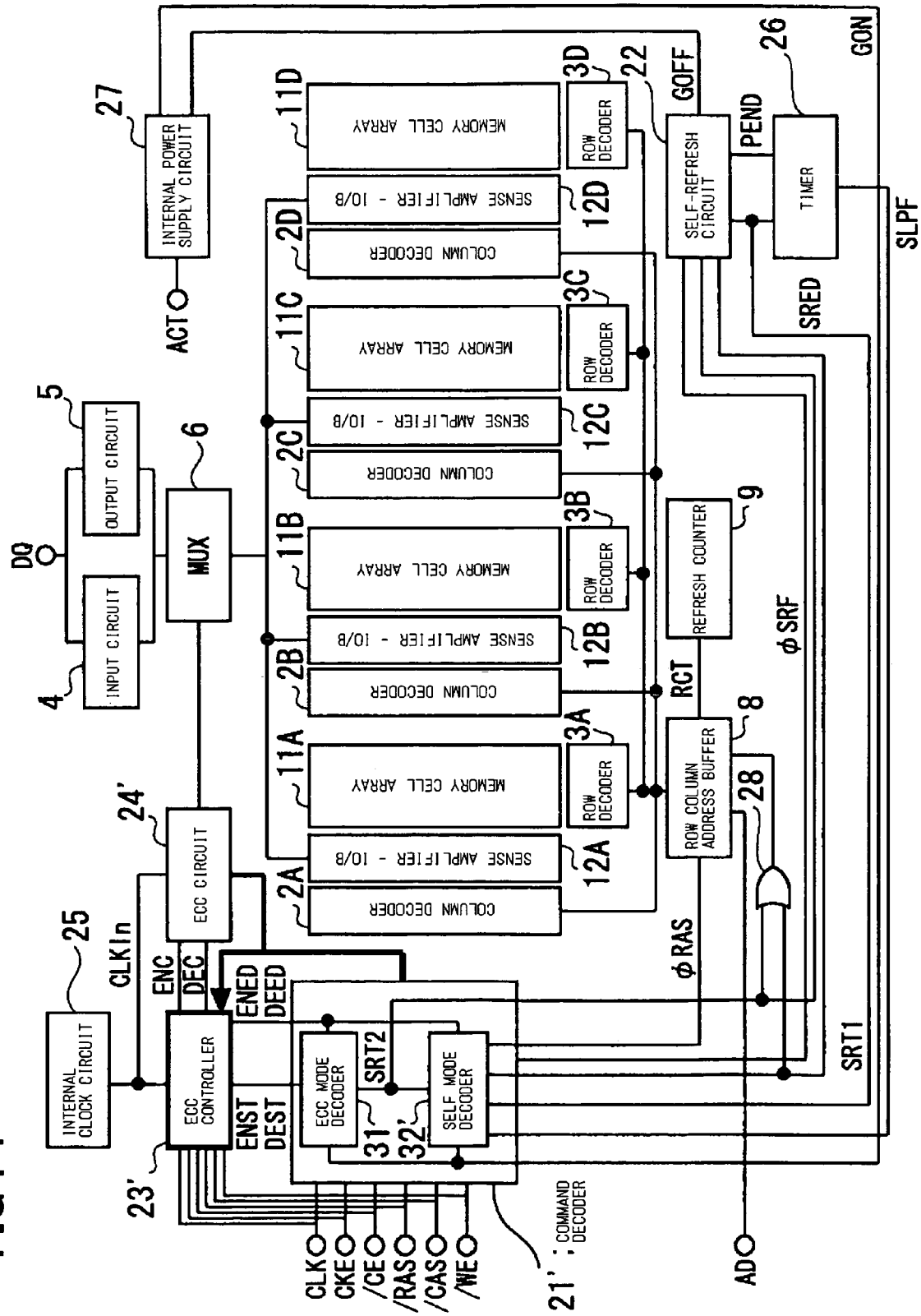
FIG. 1 is a diagram showing the overall configuration of a semiconductor memory device according to an embodiment of the present invention.

FIG. 1 shows the configuration of an embodiment of the present invention. In FIG. 1, the parts or components which are the same as those shown in FIG. 11 are depicted by the same reference numerals as in FIG. 11. Referring to FIG. 1, the present embodiment differs from FIG. 11 as to control signals, such as Ready, which are coupled across a command decoder 21', an ECC controller 23' and an ECC circuit 24' of FIG. 11, such that the control configuration for the command decoder 21' and the ECC controller 23' differs from that for the conventional semiconductor memory device, described with reference to FIGS. 11 and 12. In the following, the configuration which is the same as that of FIG. 11 is not described and the point of difference from the conventional semiconductor memory device, described with reference to FIGS. 11 and 12 is mainly described.

Figure 2:
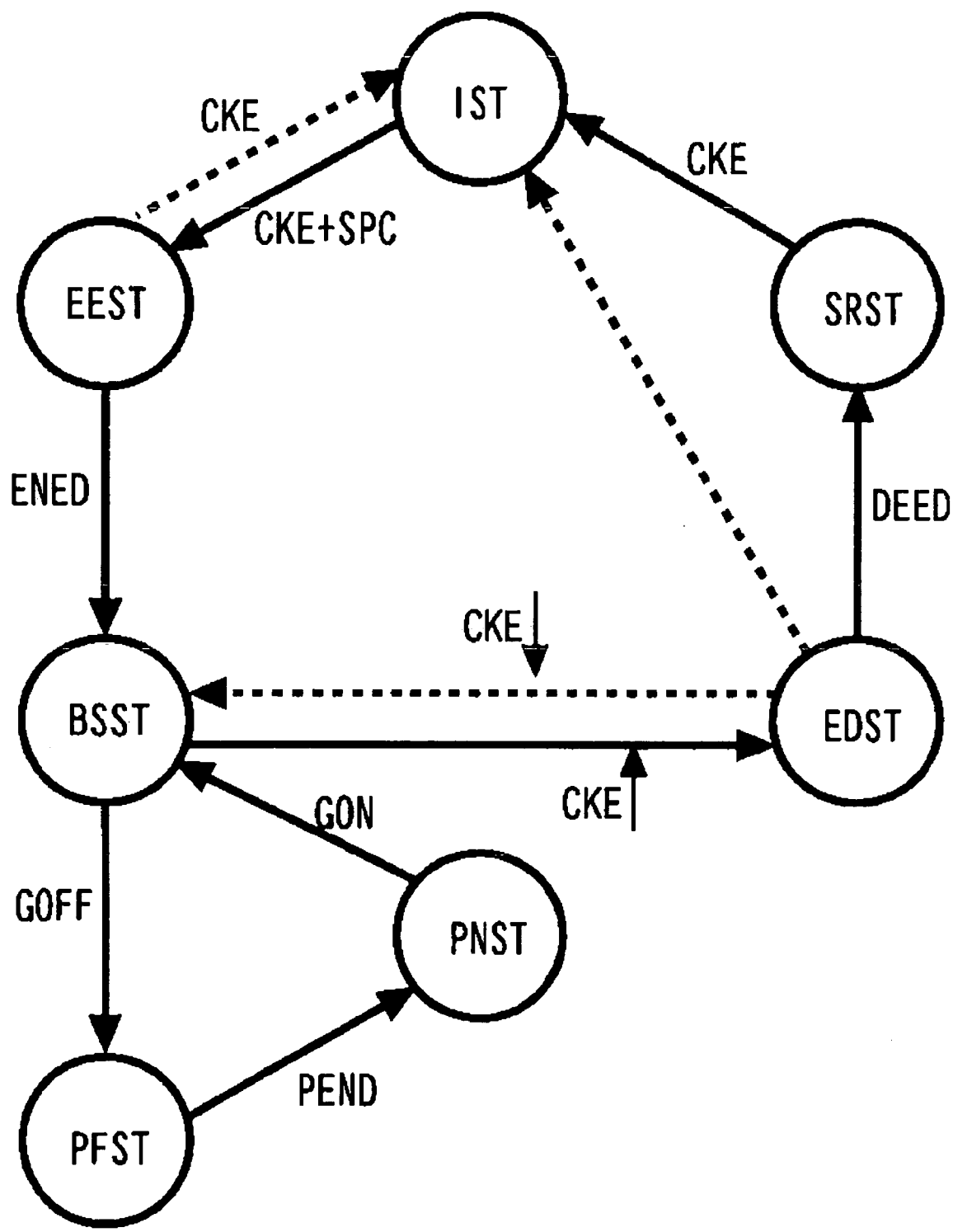
FIG. 2 is a status transition diagram showing the internal operations of the semiconductor memory device.

FIG. 2 shows an example of status transition of FIG. 1. The operation of the present embodiment will now be described with reference to FIGS. 1 and 2.

As a command for a super low power consumption mode (SPC) is entered, a semiconductor memory device having a data retention mode of the super low power consumption, referred to below as the 'SSR mode', enters from the usual operating mode (idle state: IST) to the data retention mode in the SSR mode. Meanwhile, the clock enable signal CKE is changed to a low level, in synchronism with the rise of the clock signal CLK. A command for entry to the SSR mode (SPC) is entered. As the SSR mode entry command (SPC), a low level chip enable signal /CE, a high-level row address strobe signal /RAS, a high-level column address strobe signal /CAS and a low-level write enable signal /WE are supplied to the command decoder 21', in synchronism with the clock signal CLK. The ECC mode decoder 31 and the self mode decoder 32', making up the command decoder 21', decodes a low level chip enable signal /CE, high-level row address strobe signal /RAS, high-level column address strobe signal /CAS and the low-level write enable signal /WE, indicating the command SPC, and determines that the mode currently set is the super low power consumption. Thus, the command decoder 21' generates a high-level encoding start signal ENST and sends the so generated signal to the ECC controller 23', while setting a super low power flag SLPF and an encoding flag. The ECC mode decoder 31 also sets the super low power flag SLPF.

The ECC circuit 24' encodes the totality of bits of the memory cell array and check bits (parity) are stored in a check bit area in the memory cell array (ECC encoding state EEST). Based on the encoding start signal ENST in the activated state (high level), the ECC controller 23' generates the internal command, address AD and the encoding flag ENC, in synchronism with the internal clock signal CLKIn, to send the internal command and the address AD to the command decoder 21' as well as to send the encoding flag ENC to the ECC circuit 24'. Based on the encoding flag ENC in the activated state, the ECC circuit 24' accesses the four banks, via multiplexer 6, in synchronism with the internal clock signal CLKIn, and activates proper word lines of the memory cell arrays 11A to 11D to carry out calculations on parity bits for correcting the errors of refresh failure bits and writing into the parity area in the memory cells.

If, in the ECC circuit 24', the ECC controller 23' has finished parity calculations for all memory cells making up the memory cell arrays 11A to 11D and writing parity data in the parity areas of the memory cells, the ECC controller 23' sends the encoding end signal ENED in the activated state (high level) to the ECC mode decoder 31 and to the self mode decoder 32'.

When supplied from the ECC controller 23' with the encoding end signal in the activated state ENED, the ECC mode decoder 31 resets the encoding flag ENC. On the other hand, when supplied from the ECC controller 23' with the encoding end signal ENED in the activated state, the self mode decoder 32' generates the second self-refresh start signal SRT2 in the activated state (high level), because in this case the super low power flag SLPF has been set. The self mode decoder sends the so generated signal to the self refresh circuit 22, OR circuit 28 and to the ECC mode decoder 31. Thus, transition is made from the ECC encoding state to the burst self-refresh state BSST.

If, in the present embodiment, the clock enable signal CKE goes high from low, during encoding by the ECC circuit 24', the ECC controller 23' resets the encoding flag ENC from the activated state (high level) to the inactivated state (low level). Since the encoding end signal ENED in the activated state (high level) is not supplied to the self mode decoder 32', from the ECC controller 23', the self mode decoder 32' does not generate the second self-refresh start signal SRT2 in the activated state (high level), even though the super low power flag SLPF has been set. The self mode decoder 32' also resets the super low power flag SLPF so that reversion is made to the idle state IST. This control mechanism is one of the features of the present invention.

If, in the burst self-refresh state BSST, the burst self-refresh for the totality of the word lines of the totality of the memory cell arrays 11A to 11D is finished, the self-refresh circuit 22 outputs a self-refresh end signal SRED to send the signal to the self mode decoder 32' and to the timer 26. The self-refresh circuit also generates an internal power supply OFF signal GOFF in the activated state (high level) to send the so generated signal to the internal power supply circuit 27. Thus, transition is made from the burst self-refresh state BSST to the power-off state PFST. In this power-off state PFST, supply of part of the internal power supply voltage to the inside of the semiconductor memory device is halted. The timer 26 commences to count the internal power supply OFF time, based on the SRED in the activated state (high level).

If, in the power-off state PFST, the internal power supply OFF time has lapsed and the timer 26 has timed out, the internal power supply OFF end signal PEND is output to the self-refresh circuit 22. Since the self-refresh circuit 22 activates the internal power supply circuit 27, based on the internal power supply OFF end signal PEND, the internal power supply OFF signal GOFF is inactivated, and transition is made from the power-off state PFST to the power-on state PNST.

If then it is detected that the power supply potential, monitored by the internal power supply circuit 27, has reached a preset potential, the internal power supply OFF signal GOFF in the activated state (high level) is sent to the ECC mode decoder 31 and to the self mode decoder 32'. Since the internal power supply OFF signal GOFF is in the activated state (high level) and the current mode is the super low power consumption mode, the ECC mode decoder 31 generates the second self-refresh start signal SRT2 in the activated state (high level) to send the so generated signal to the self-refresh circuit 22, OR circuit 28 and to the ECC mode decoder 31. This causes transition from the power-on state PNST to the burst self-refresh state BSST.

If, in the burst self-refresh state BSST, the clock enable signal CKE is changed from a low level to a high level, in order to cancel the SSR mode, and an exit command is entered, the self mode decoder 32' resets the internal super low power flag, while causing transition of the second self-refresh start signal SRT2 from the activated state (high level) to the inactivated state (low level), to send the so changed signal to the self-refresh circuit 22, OR circuit 28 and to the ECC mode decoder 31. Responsive to the exit command and to transition of the CKE from a low level to a high level, the ECC mode decoder 31 resets the super low power flag SLPF and generates a decoding start signal DEST to send the so generated signal to the ECC controller 23' to set the decode flag. This causes transition from the burst self-refresh state to the ECC decoding state EDST.

That is, the self-refresh circuit 22 discontinues the generation of the self-refresh signal φSRF, based on the second self-refresh start signal SRT2 in a low level. Since this causes the cessation of supply of the self-refresh signal φSRF from the SLPF self-refresh circuit 22 to the command decoder 21', generation of the row-address strobe signal φRAS is discontinued. On the other hand, the ECC controller 23' generates the internal command, address AD and the decode flag DEC, for controlling the readout and write operations during decoding, in synchronism with the internal clock signal CLKIn, based on the decoding start signal DEST in the activated state (high level), and sends the internal command and the address AD to the command decoder 21', while sending the decode flag DEC to the ECC circuit 24'. The ECC circuit 24' then accesses the bank, via multiplexer 6, based on the decode flag DEC, in synchronism with the internal clock signal CLKIn, to carry out calculation on parity bits or correct error on a refresh failure bit. If, in the ECC circuit 24', the decoding as commanded is finished, the ECC controller 23' sends the decoding end signal DEED in the activated state (high level) to the ECC mode decoder 31 and to the self mode decoder 32'. This causes the self mode decoder 32' to generate the first self-refresh start signal SRT1 in the activated state (high level) to send the so generated signal to the self-refresh circuit 22 and to the OR circuit 28. This causes transition from the ECC decoding state EDST to the self-refresh state SRST.

Meanwhile, if, in the ECC decoding state EDST, the clock enable signal CKE goes from high to low, during error correction by the ECC circuit 24', to indicate re-entry, the ECC controller 23' resets the decode flag DEC from the activated state (high level) to the inactivated state (low level). The ECC circuit 24' halts the decoding by the decoding circuit and, after post-processing, outputs a READY signal. It is noted that, when entry has been made to the ECC decoding state EDST, CKE is at a high level, while SLPF is reset and is at a low level. The ECC mode decoder 31 resets the decode flag. The decoding end signal DEED is at a low level (since the decoding is not finished as yet, the signal DEED is not set to the activated state (high level)). Thus, the self mode decoder 32 does not generate the first self-refresh start signal SRT1 in the activated state (high level). When the READY signal by the ECC circuit 24' and the super low power flag SLPF are low, with the super low power flag SLPF being in a reset state, the second self-refresh start signal SRT2 in the activated state (high level) is generated and supplied to the self-refresh circuit 22, OR circuit 28 and to the ECC mode decoder 31. Then, transition is made to the burst self-refresh state BSST. This configuration of making re-entry to the burst self-refresh state BSST of the SSR mode from the ECC decoding state EDST in the DDR mode exiting state, with the SLPF flag remaining inactivated, represents one of the features of the present invention.

For canceling the self-refresh state SRST, the clock enable signal CKE is caused to change from a low level to a high level. The self mode decoder 32' causes the first self-refresh start signal SRT1 to change from the activated state (high level) to the inactivated state (low level). The self-refresh circuit 22 discontinues its generation of the self-refresh signal φ SRF, based on the first self-refresh start signal SRT1 which is in the activated state. The command decoder 21' is not supplied with the self-refresh signal φ SRF from the self-refresh circuit 22 and hence discontinues its generation of the row-address strobe signal φ RAS to transfer from the self-refresh state SRST to the idle state IST.

Meanwhile, in the present embodiment, transition may be made from the ECC decoding state EDST to the idle state IST such as to skip the self-refresh state SRST. That is, when the decoding as commanded is finished, in the ECC circuit 24', the ECC controller 23' sends the decoding end signal DEED in the inactivated state (high level) to the ECC mode decoder 31 and to the self mode decoder 32'. The ECC mode decoder 31 resets the decode flag. The self mode decoder 32' does not generate the first self-refresh start signal SRT1, based on the decoding end signal DEED in the inactivated state (high level). This causes transition from the ECC decoding state EDST to the idle state IST. This configuration represents another feature of the present invention.

Figure 3:
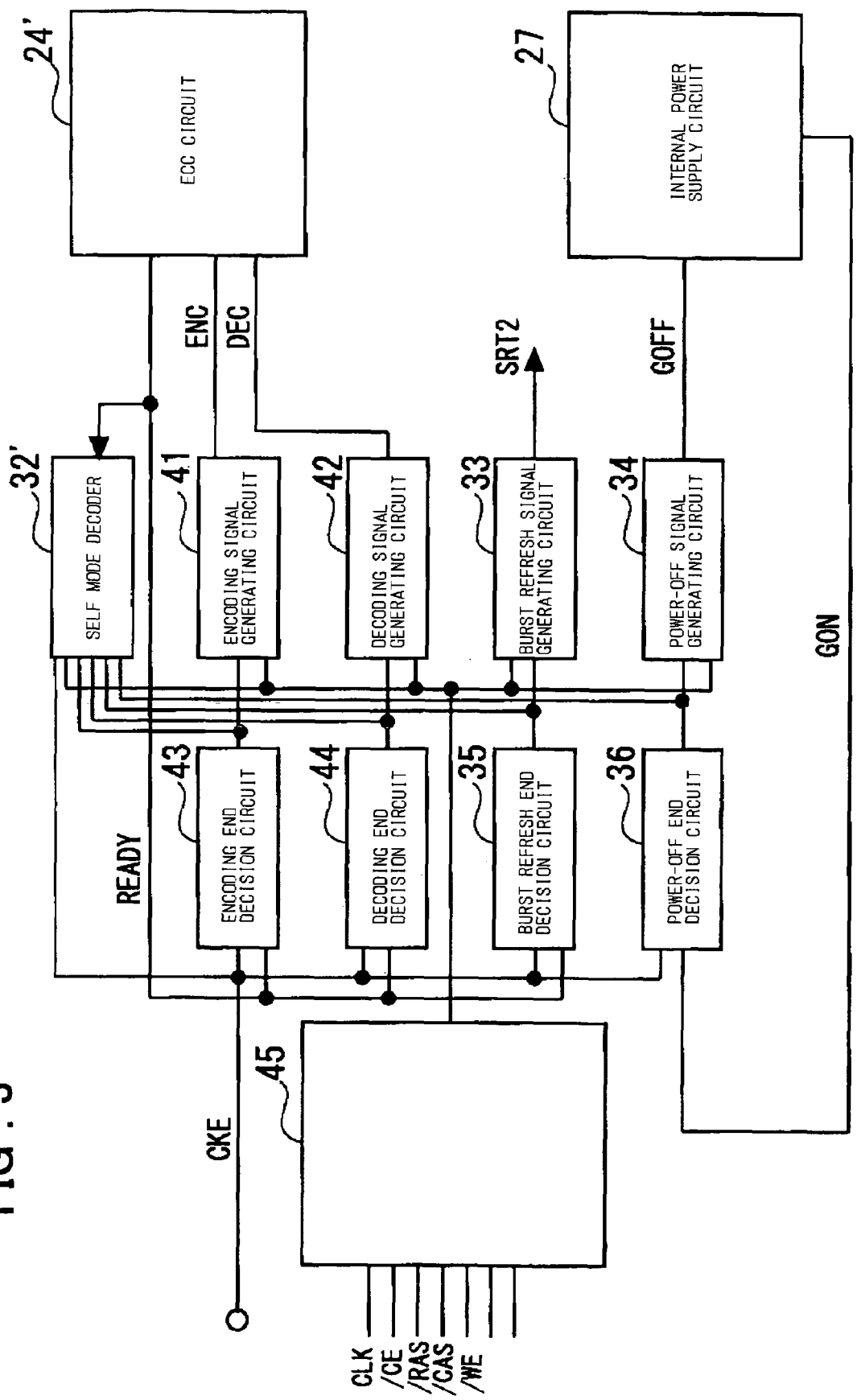
FIG. 3 is a diagram showing the control configuration of the semiconductor memory device.

FIG. 3 shows component elements of the ECC controller 23' and the command decoder 21' of the present embodiment which are relevant to the control function characteristic of the present invention. Referring to FIG. 3, there are provided a self mode decoder 32', a burst refresh signal generating circuit 33, a power-off signal generating circuit 34, a burst refresh signal generating circuit 35 and a power-off end decision circuit 36, that form the command decoder 21' of FIG. 1. There are also provided an encoding signal generating circuit 41 for generating an encoding flag ENC, a decoding signal generating circuit 42 for generating a decode flag DEC, an encoding end decision circuit 43 and a decoding end decision circuit 44, that form the ECC controller 23' of FIG. 1. There is also provided a control circuit 45, supplied with and decoding input control signals (/CE, /RAS, /CAS and /WE) to control various circuits, and which also forms the ECC controller 23'.

The self mode decoder 32' is supplied with the control signal from the ECC circuit 24' and output signals of the encoding end decision circuit 43, decoding end decision circuit 44, burst refresh signal generating circuit 35 and the power-off end decision circuit 36 to output control signals, such as SRT2.

The encoding signal generating circuit 41 activates the encoding flag ENC, based on a control signal from the control circuit 45, to output the resulting signal to the ECC circuit 24', and inactivates the encoding flag ENC (to a low level) based on an output of the encoding end decision circuit 43.

Based on the control signal from the control circuit 45, the decoding signal generating circuit 42 activates the decode flag DEC to output the resulting activated signal to the ECC circuit 24', while inactivating the decode flag DEC, based on an output of the decoding end decision circuit 44.

The burst refresh signal generating circuit 33 activates the second self-refresh start signal SRT2 (to a high level), based on a control signal from the control circuit 45, to output the resulting high-level signal to the self-refresh circuit 22, OR circuit 28 and to the ECC mode decoder 31, and inactivates the second self-refresh start signal SRT2 (to a low level), based on an output of the burst refresh signal generating circuit 35.

The power-off signal generating circuit 34 also activates the internal power supply OFF signal GOFF (to a low level), based on a control signal from the control circuit 45, to output the resulting signal to the internal power supply circuit 27, and sets the internal power supply OFF signal GOFF to the inactivated state (low level), based on an output of the power-off end decision circuit 36.

The encoding end decision circuit 43, decoding end decision circuit 44 and the burst refresh signal generating circuit 35 are supplied with the clock enable signal CKE and the signal READY to perform judgement regarding the end of the encoding, decoding and burst refresh, while the power-off end decision circuit 36 is supplied with the clock enable signal CKE and with the signal GON to verify the end of power-off. The internal power supply OFF signal GOFF, output from the power-off signal generating circuit 34 of FIG. 3, and the internal power supply OFF signal GOFF, output from the self-refresh circuit 22 of FIG. 1, are sent to the internal power supply circuit 27, via e.g. an OR circuit, not shown.

Figure 4:
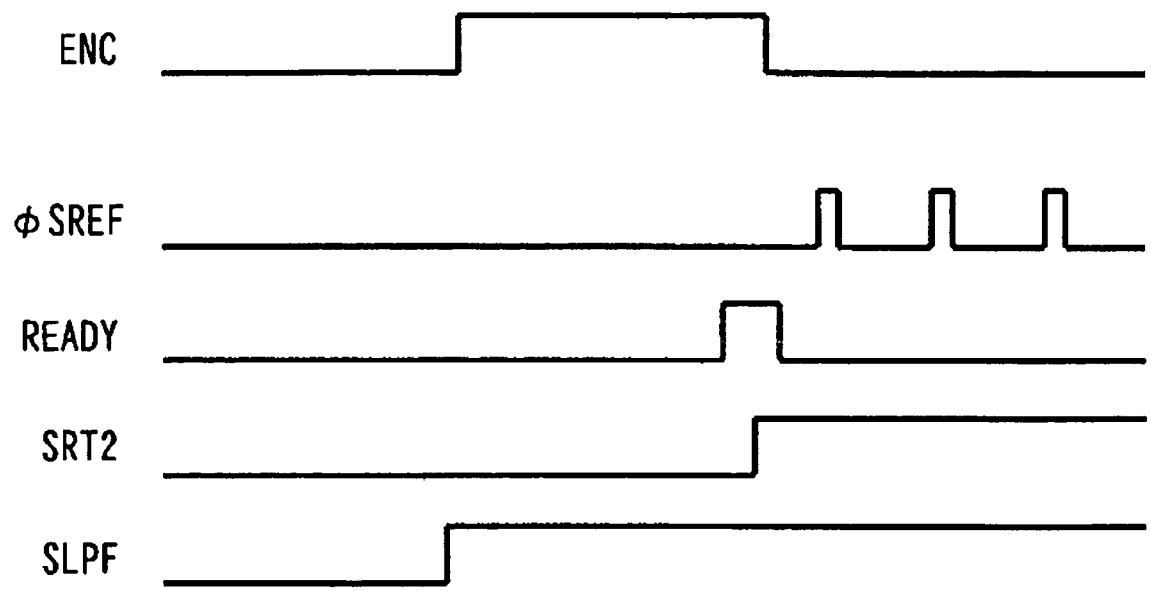
FIG. 4 is a timing diagram showing the operation (encoding end) of the embodiment of the present invention.

FIG. 4 is a timing diagram showing a typical operation of transition from the ECC encoding state EEST of FIG. 2 to the burst self-refresh state BSST. Referring to FIG. 4, the ECC circuit 24' is responsive to the signal ENC in the inactivated state (high level) from the encoding signal generating circuit 41 (see FIG. 3) to execute encoding. When the encoding is finished, the signal READY from the ECC circuit 24' is activated (to a high level).

The encoding end decision circuit 43, supplied with the READY signal of the activated state (high level), judges that the encoding has been finished. The encoding signal generating circuit 41 sets the encoding flag ENC to a low level and outputs an ENED signal (see FIG. 1) to the ECC mode decoder 31 and to the self mode decoder 32' to transfer to the burst self-refresh state BSST. That is, the self mode decoder 32' inactivates the second self-refresh start signal SRT2 to a high level and outputs the self-refresh signal φ SRF. The super low power flag SLPF goes high at the time of entry to SSR.

Figure 5:
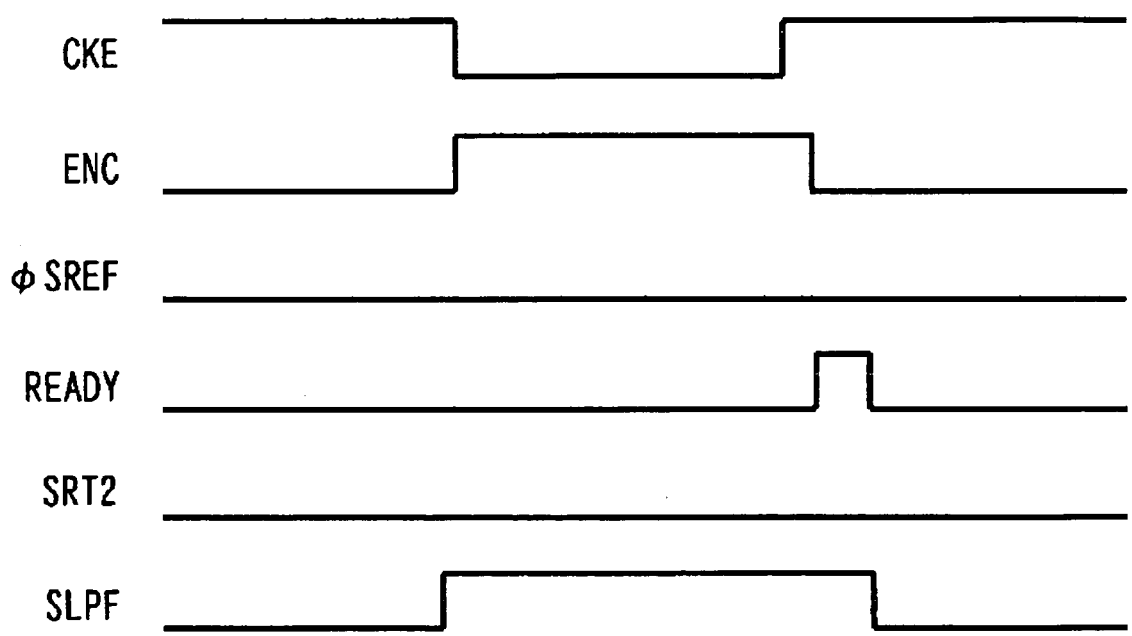
FIG. 5 is a timing diagram showing the operation (exiting during encoding) of the embodiment of the present invention.

FIG. 5 is a timing diagram for illustrating typical exiting processing during encoding. Referring to FIG. 5, the ECC circuit 24' is responsive to the signal ENC in the activated state (high level) from the encoding signal generating circuit 41 to execute the encoding. If, before completion of the encoding by the ECC circuit 24', that is, with the READY signal being in a low level, the clock enable signal CKE changes from low to high (command for canceling the SSR mode), the encoding end decision circuit 43 judges that the current state is the encoding exiting state, and commands the encoding signal generating circuit 41 to set the ENC signal low. The ECC circuit 24' discontinues the encoding to carry out post-processing and, after the end of the post-processing, sets the READY signal to the activated state (high level). The encoding end decision circuit 43, supplied with the READY signal, does not output the ENED signal to the ECC mode decoder 31 or to the self mode decoder 32', because the circuit has received a high level READY signal with the clock enable signal CKE being in a high level state. The self mode decoder 32' receives the READY signal in the activated state (high level) and the ENED signal in the inactivated state and verifies that the encoding has been discontinued. The self mode decoder resets the super low power flag SLPF and returns to the idle state by not activating the second self-refresh start signal SRT2 (to a high level) and by not outputting the self-refresh signal φ SRF.

Figure 6:
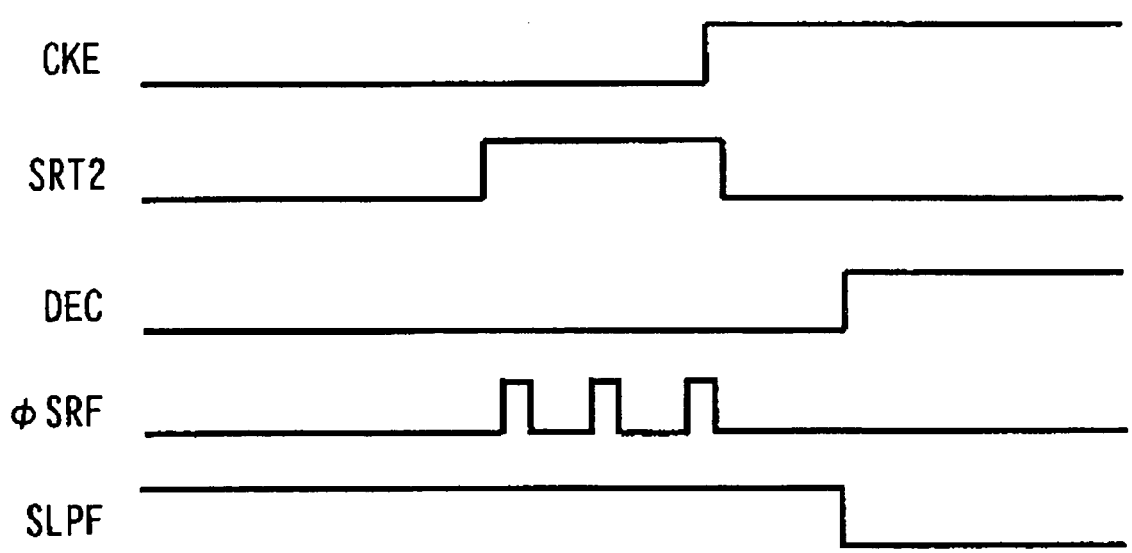
FIG. 6 is a timing diagram showing the operation (exiting during burst self-refresh) of the embodiment of the present invention.

FIG. 6 is a timing diagram for illustrating typical exiting processing during burst self-refresh in the present embodiment. If, as the second self-refresh start signal SRT2 is in the activated state (high level) state, the clock enable signal CKE changes from low to high, as shown in FIG. 6, the burst refresh signal generating circuit 35 judges that the burst self-refresh is to be discontinued, and commands the burst refresh signal generating circuit 33 to set the second self-refresh start signal SRT2 to a low level. The self mode decoder 32' resets the flag SLPF and commands the ECC circuit 24', via ECC mode decoder 31 and command decoder 21', to carry out decoding. The decoding signal generating circuit 42 activates the decode flag DEC to a high level, and the ECC circuit 24' executes the decoding.

Figure 7:
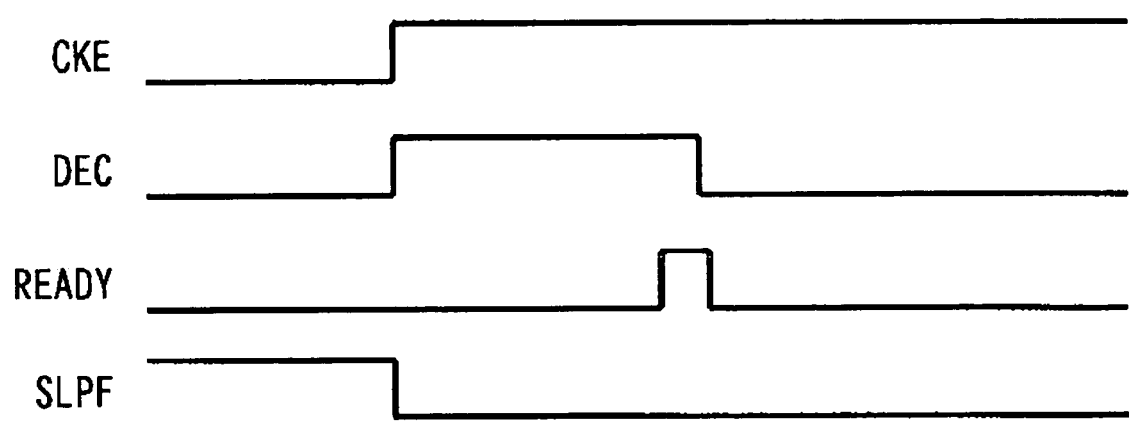
FIG. 7 is a timing diagram showing the operation (decoding end) of the embodiment of the present invention.

FIG. 7 is a timing diagram for illustrating a typical operation for a case where decoding has been finished in the ECC circuit 24' of FIG. 1. Referring to FIG. 7, since the current processing is the processing of exiting from the SSR mode (with both the CKE and READY high), the super low power flag SLPF is reset to the inactivated state (low level), the clock enable signal CKE is set to a high level, and the decode flag DEC is set to the activated state (high level). Hence, the ECC circuit 24' executes the decoding. On receipt of the RADY signal in the activated state from the ECC circuit 24', the decoding end decision circuit 44 judges that the decoding has been finished. Thus, the decoding signal generating circuit 42 sets the decode flag DEC to the inactivated state (low level).

Figure 8:
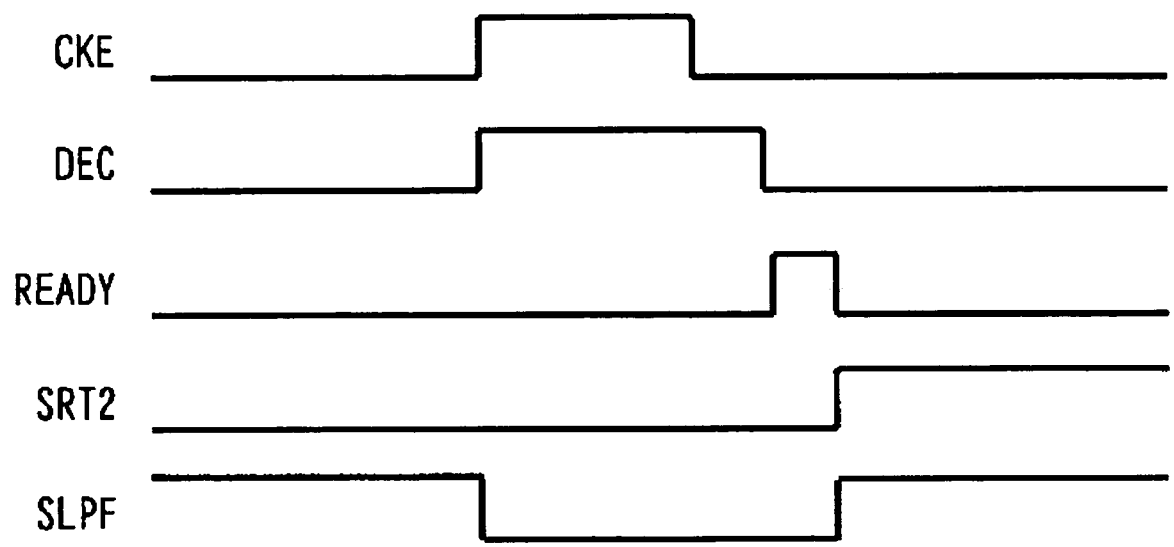
FIG. 8 is a timing diagram showing the operation (re-entry during decoding) of the embodiment of the present invention.

FIG. 8 shows a typical operation for a case where re-entry is made to the SSR mode during decoding carried out by the ECC circuit 24'. Since the current processing is the processing of exiting from the SSR mode, the super low power flag SLPF has been reset to a low level, the clock enable signal CKE has been set to a high level, the decode flag DEC has been set to the activated state (high level), and the decoding is carried out in the ECC circuit 24'. Before the READY signal is output from the ECC circuit 24', the clock enable signal CKE changes from high to low. The decoding end decision circuit 44 judges this to be re-entry to SSR (with the CKE and READY signals being low and high, respectively). The decoding signal generating circuit 42 sets the decode flag DEC to the inactivated state (low level). On receipt of the high-level signal READY from the ECC circuit 24', the burst refresh signal generating circuit 33 activates the second self-refresh start signal SRT2 to a high level. The self mode decoder 32' sets the super low power flag SLPF to a high level.

With the present embodiment, re-entry to the SSR mode may be made during processing for exiting from the SSR mode. Thus, re-entry may be made to the SSR mode to carry out the next operation, without waiting.

Figure 9:
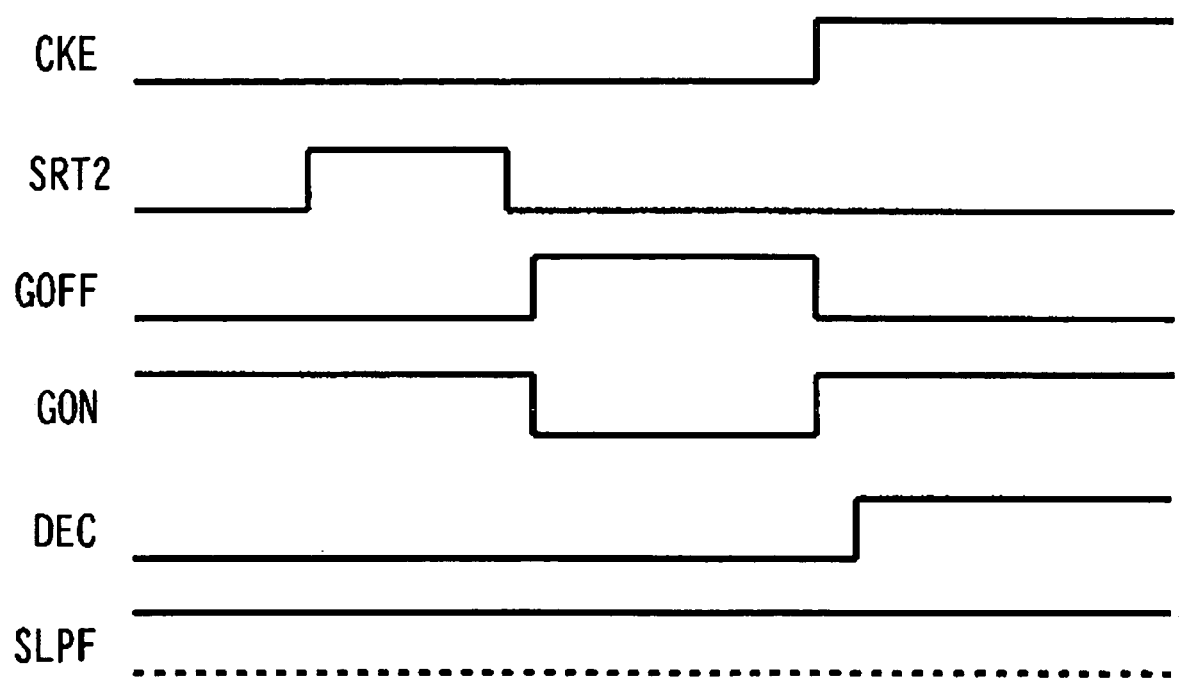
FIG. 9 is a timing diagram showing the operation (exiting during power-off) of a modified embodiment of the present invention.
Figure 10:
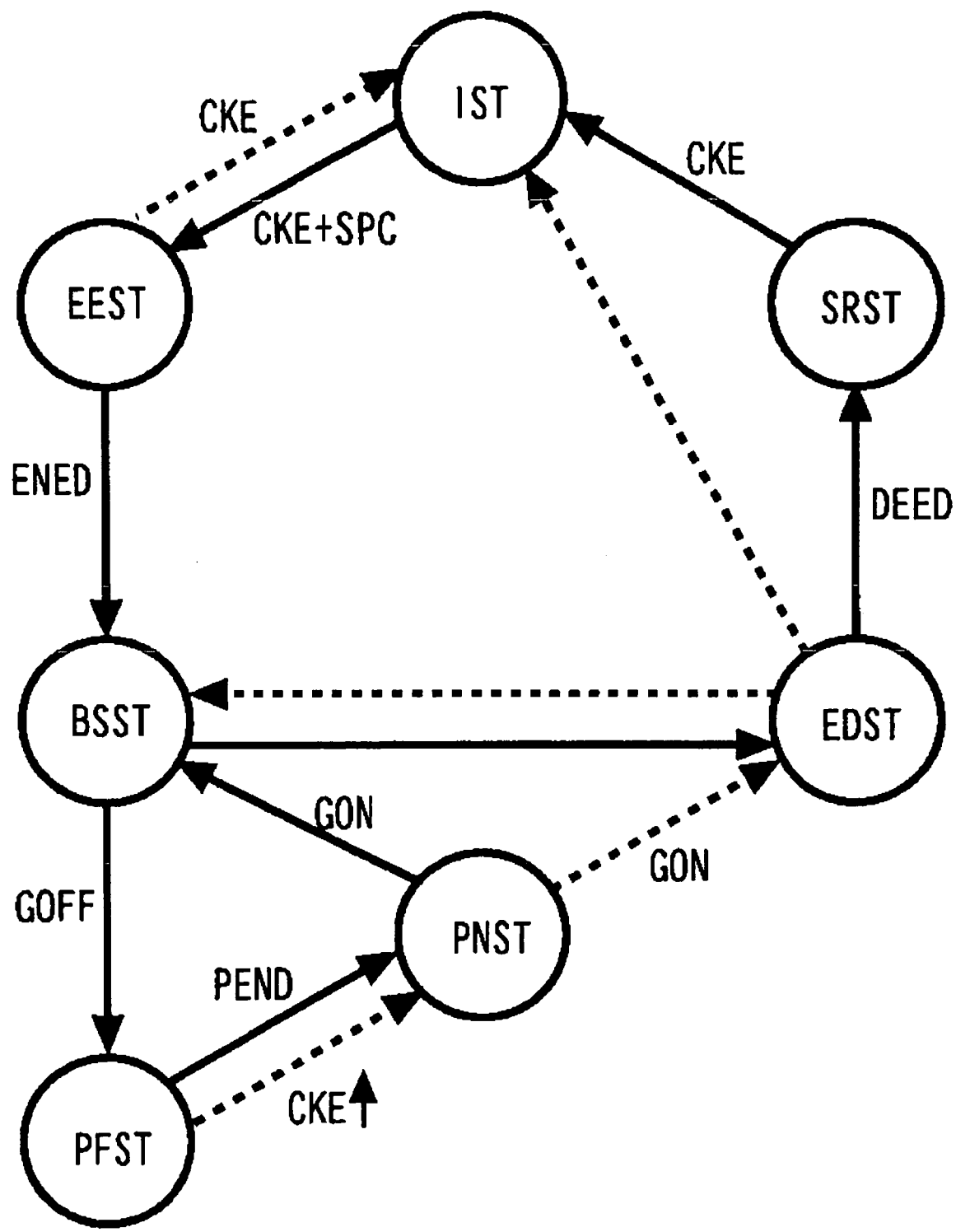
FIG. 10 is a status transition diagram showing another example of the internal operations of the semiconductor memory device.

FIG. 9 illustrates the processing of a modification of the embodiment shown in FIG. 1. FIG. 10 shows status transition as FIG. 9. In the power-off state, the internal power supply OFF signal GOFF is set to the activated state (high level). If the clock enable signal CKE has been set to a high level, before the Signal GOFF goes low, the power-off end decision circuit 36 judges this state to be an SSR mode exiting state. The power-off signal generating circuit 34 inactivates the internal power supply OFF signal GOFF to a low level. Responsive thereto, the internal power supply circuit 27 undergoes a transition to the power-on (recovery) state. When the internal power supply ON signal GON from the internal power supply circuit 27 is activated to a high level, the self mode decoder 32' activates the decode flag DEC to an activated (high-level) state, through the ECC mode decoder 31 and the ECC controller 23', without activating the second self-refresh start signal SRT2 to the activated state (high level). This causes the ECC circuit 24' to transfer to the decoding operation. That is, referring to FIG. 10, when the clock enable signal changes from low to high, in the power-off state PFST, transition is made to the power-on state PNST. If the signal GON is in a high level, transition is made to the ECC decoding state EDST. In similar manner, if a command for canceling the SSR mode is issued in the power-on (recovery state) PNST, transition may, of course, be made immediately to the ECC decoding state EDST when the internal power supply ON signal GON has been activated to a high level, such as to skip the burst self-refresh state BSST.

Although the present invention has been described with reference to preferred embodiments thereof, it is to be noted that the present invention is not limited to the embodiments described and that various changes or corrections may be made within the scope of the invention insofar as these changes or corrections are feasible by those skilled in the art.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A method for controlling a semiconductor memory device comprising a plurality of memory cells in need of refresh for data retention and having a data retention mode with power control; wherein said data retention mode includes:
   a burst self-refresh state in which said memory cells are self-refreshed in a burst with a period shorter than in ordinary self-refresh;
   a power-off state in which an internal power supply circuit is partially turned off; and
   a power-on state in which said internal power supply circuit, partially turned off, is turned on; said method comprising:
   making an entry from an idle state into said data retention mode; and
   making a re-entry into said data retention mode from a preset one of said states of said data retention mode, without making return to said idle state by completing an exit process from said data retention mode, when a command for exiting from said data retention mode is received during said data retention mode.

2. The method according to claim 1, wherein said data retention mode further includes:
   an encoding state by an error correction circuit in which said error correction circuit carries out calculation of parity bits of data of said memory cells; and
   a decoding state by said error correction circuit in which said error correction circuit corrects errors of said memory cells; said method comprising:
   transferring to said encoding state by said error correction circuit on making entry from said idle state to said data retention mode;

transferring to said burst self-refresh state on termination of said encoding state by said error correction circuit;

repeating said burst self-refresh state, said power-off state and said power-on state in this order until receipt of a command for exiting from said data retention mode;

performing control for making transition from said burst self-refresh state to said decoding state by said error correction circuit, on receipt of said command for exiting from said data retention mode; and transferring to said idle state on receipt in said encoding state by said error correction circuit of said command for exiting from said data retention mode.

3. The method according to claim 2, further comprising performing control to cause transition from the decoding state by the error correction circuit to said burst self-refresh state, when a command for re-entry to said data retention mode is received in said decoding state by the error correction circuit.

4. The method according to claim 2, further comprising performing control to cause transition from said power-off state or said power-on state to said decoding state by the error correction circuit, without transition from said power-off state or said power-on state to said burst self-refresh state, when a command from exiting said data retention mode is received in said power-off state or said power-on state.

5. The method according to claim 2, further comprising performing control to cause transition from said decoding state by the error correction circuit to said idle state without transition from said decoding state by the error correction circuit to the ordinary self-refresh state.

6. A semiconductor memory device comprising a plurality of memory cells in need of refresh for data retention and having a data retention mode with power control; wherein said data retention mode includes:
 a burst self-refresh state in which said memory cells are self-refreshed in a burst with a period shorter than in ordinary self-refresh;
 a power-off state in which an internal power supply circuit is partially turned off; and
 a power-on state in which said internal power supply circuit, partially turned off, is turned on; said semiconductor memory device comprising:
 a circuit for performing control for making an entry from an idle state into said data retention mode; and
 a circuit for performing control for making a re-entry into said data retention mode from a preset one of said states of said data retention mode, without making return to said idle state by completing an exit process from said data retention mode, when a command for exiting from said data retention mode is received during said data retention mode.

7. The semiconductor memory device according to claim 6, further comprising an error correction circuit including an encoding circuit for appending parity information to memory cell data and a decoding circuit for checking the memory cell data for error and correcting the error if there is any;
 wherein said data retention mode further includes:
 an encoding state by said error correction circuit in which said error correction circuit carries out calculation for appending parity information to memory cell data; and
 a decoding state by said error correction circuit in which said error correction circuit corrects error of said memory cell;
 said semiconductor memory device comprising
 a circuit for performing control for transferring to said encoding state by said error correction circuit on making entry from said idle state to said data retention mode;
 transferring to said burst self-refresh state on termination of said encoding state by said error correction circuit;
 repeating said burst self-refresh state, said power-off state and said power-on state in this order until receipt of a command for exiting from said data retention mode;
 transferring from said burst self-refresh state to said decoding state by said error correction circuit, on receipt of said command for exiting from said data retention mode; and
 transferring to said idle state on receipt in said encoding state by said error correction circuit of said command for exiting from said data retention mode.

8. The semiconductor memory device according to claim 7, further comprising
 a circuit for performing control to cause transition from the decoding state by the error correction circuit to said burst self-refresh state when a command for re-entry to said data retention mode is received in said decoding state by the error correction circuit.

9. The semiconductor memory device according to claim 7, further comprising
 a circuit for performing control to cause transition from said power-off state or said power-on state to said decoding state by the error correction circuit, without transition from said power-off state or said power-on state to said burst self-refresh state, when a command from exiting said data retention mode is received in said power-off state or said power-on state.

10. The semiconductor memory device according to claim 7, further comprising
 a circuit for performing control to cause transition from said decoding state by the error correction circuit to said idle state without transition from said decoding state by the error correction circuit to the ordinary self-refresh state.

* * * * *